(12) United States Patent
Zhang et al.

(10) Patent No.: US 11,066,902 B2
(45) Date of Patent: Jul. 20, 2021

(54) POWER MANAGEMENT SYSTEM FOR A DRILLING RIG

(71) Applicant: Caterpillar Inc., Deerfield, IL (US)

(72) Inventors: Yanchai Zhang, Dunlap, IL (US); Maurice Dust, Edwards, IL (US)

(73) Assignee: Caterpillar Inc., Peoria, IL (US)

( * ) Notice: Subject to any disclaimer, the term of this patent is extended or adjusted under 35 U.S.C. 154(b) by 146 days.

(21) Appl. No.: 16/413,798

(22) Filed: May 16, 2019

(65) Prior Publication Data

US 2020/0362690 A1    Nov. 19, 2020

(51) Int. Cl.
*E21B 41/00* (2006.01)
*G01R 21/133* (2006.01)
*E21B 47/12* (2012.01)

(52) U.S. Cl.
CPC .............. *E21B 41/00* (2013.01); *E21B 47/12* (2013.01); *G01R 21/133* (2013.01)

(58) Field of Classification Search
CPC .................................. E21B 47/12; E21B 41/00
See application file for complete search history.

(56) References Cited

U.S. PATENT DOCUMENTS

| | | | |
|---|---|---|---|
| 6,892,812 B2 | 5/2005 | Niedermayr et al. | |
| 9,803,461 B2 | 10/2017 | Boone | |
| 2009/0312885 A1* | 12/2009 | Buiel | H02J 3/32 |
| | | | 700/297 |
| 2015/0371344 A1 | 12/2015 | Khare et al. | |
| 2017/0145805 A1 | 5/2017 | Tharaldsen | |
| 2017/0204705 A1 | 7/2017 | King | |
| 2019/0122151 A1* | 4/2019 | Hildebrand | E21B 7/10 |

FOREIGN PATENT DOCUMENTS

| | | |
|---|---|---|
| EP | 1899576 B1 | 9/2017 |
| WO | 2018038963 A1 | 3/2018 |

* cited by examiner

*Primary Examiner* — Robert E Fuller
(74) *Attorney, Agent, or Firm* — Harrity & Harrity LLP (57) ABSTRACT

A power management system may monitor data relating to respective loads on a plurality of power sources. The plurality of power sources may be associated with a drilling rig engaged in a drilling process. The power management system may determine a stage of the drilling process based on the respective loads on the plurality of power sources. The power management system may determine, based on the stage of the drilling process that is determined, respective load shares for the plurality of power sources. The power management system may manage load sharing among the plurality of power sources according to the respective load shares that are determined.

20 Claims, 5 Drawing Sheets

POWER MANAGEMENT SYSTEM FOR A DRILLING RIG

TECHNICAL FIELD

The present disclosure relates generally to a power management system and, more particularly, to a power management system for a drilling rig.

BACKGROUND

Drilling rigs are used to create holes in a ground surface, such as a water well, an oil well, a gas extraction well, and/or the like. A drilling process performed by a drilling rig (e.g., in a creation of a well) includes various stages, and each stage is associated with a particular power demand. In typical drilling applications, multiple engines are simultaneously operated to satisfy a power demand of the drilling rig, whereby each of the multiple engines produces a share of the power demand proportional to the engine's capacity. However, such a rigid load-sharing configuration may not be the most fuel efficient one due to fluctuating power demands as the drilling process proceeds through the various stages. This is because each engine may have particular characteristics that make the engine more suitable for certain stages of the drilling process and less suitable for certain other stages of the drilling process.

One attempt to manage fuel and electrical power supplied to a drilling rig is disclosed in U.S. Pat. No. 9,803,461 that issued to Nabors Drilling Technologies USA, Inc. on Oct. 31, 2017 ("the '461 patent"). In particular, the '461 patent discloses an engine management module that is operatively associated with a power source and configured to monitor power consumption of a drilling rig. The '461 patent discloses that a drilling rig crew can first perform tests that determine the power requirements for specific activities on a drilling rig, or rely on a database of information regarding energy usage of various drilling rigsite activities. This information can be compared to a drilling program to plan future power needs and recommend methods to manage energy more efficiently on the drilling rig.

While the engine management module of the '461 patent may monitor power supplied to a drilling rig according to a drilling program, the '461 patent does not address managing power according to a stage of a drilling process that is determined based on data relating to a load on one or more power sources and/or a speed of the one or more power sources. Typically, a drilling program for a drilling rig is manually entered by a crew of the drilling rig. Thus, a drilling program may contain errors that cause power to be managed in a manner that is not fuel efficient and/or in a manner that may damage a power source and/or a drilling rig.

The power management system of the present disclosure solves one or more of the problems set forth above and/or other problems in the art.

SUMMARY

According to some implementations, the present disclosure is related to a method. The method may include monitoring, by a device, data relating to respective loads on a plurality of power sources, wherein the plurality of power sources are associated with a drilling rig engaged in a drilling process; determining, by the device, a stage of the drilling process based on the respective loads on the plurality of power sources, wherein the stage of the drilling process is associated with a total power output to be directed from the plurality of power sources to the drilling rig; determining, by the device and based on the stage of the drilling process that is determined, respective load shares for the plurality of power sources; and managing, by the device, load sharing among the plurality of power sources according to the respective load shares that are determined.

According to some implementations, the present disclosure is related to a power management system. The power management system may include one or more memories, and one or more processors, communicatively coupled to the one or more memories, to: monitor data relating to respective loads on a plurality of power sources and respective speeds of the plurality of power sources, wherein the plurality of power sources are associated with a drilling rig engaged in a drilling process; determine a stage of the drilling process based on the respective loads on the plurality of power sources and the respective speeds of the plurality of power sources, wherein the stage of the drilling process is associated with a total power output to be directed from the plurality of power sources to the drilling rig; determine, based on the stage of the drilling process that is determined, respective load shares for the plurality of power sources; and manage load sharing among the plurality of power sources according to the respective load shares that are determined.

According to some implementations, the present disclosure is related to a drilling rig. The drilling rig may include a plurality of power sources that power the drilling rig, and a power management system, wherein the power management system is to: monitor data relating to respective loads on the plurality of power sources; determine a stage of a drilling process performed by the drilling rig based on the respective loads on the plurality of power sources, wherein the stage of the drilling process is associated with a total power output to be directed from the plurality of power sources to the drilling rig; determine, based on the stage of the drilling process that is determined, respective load shares for the plurality of power sources; and manage load sharing among the plurality of power sources according to the respective load shares for the plurality of power sources that are determined.

DETAILED DESCRIPTION

Figure 1:
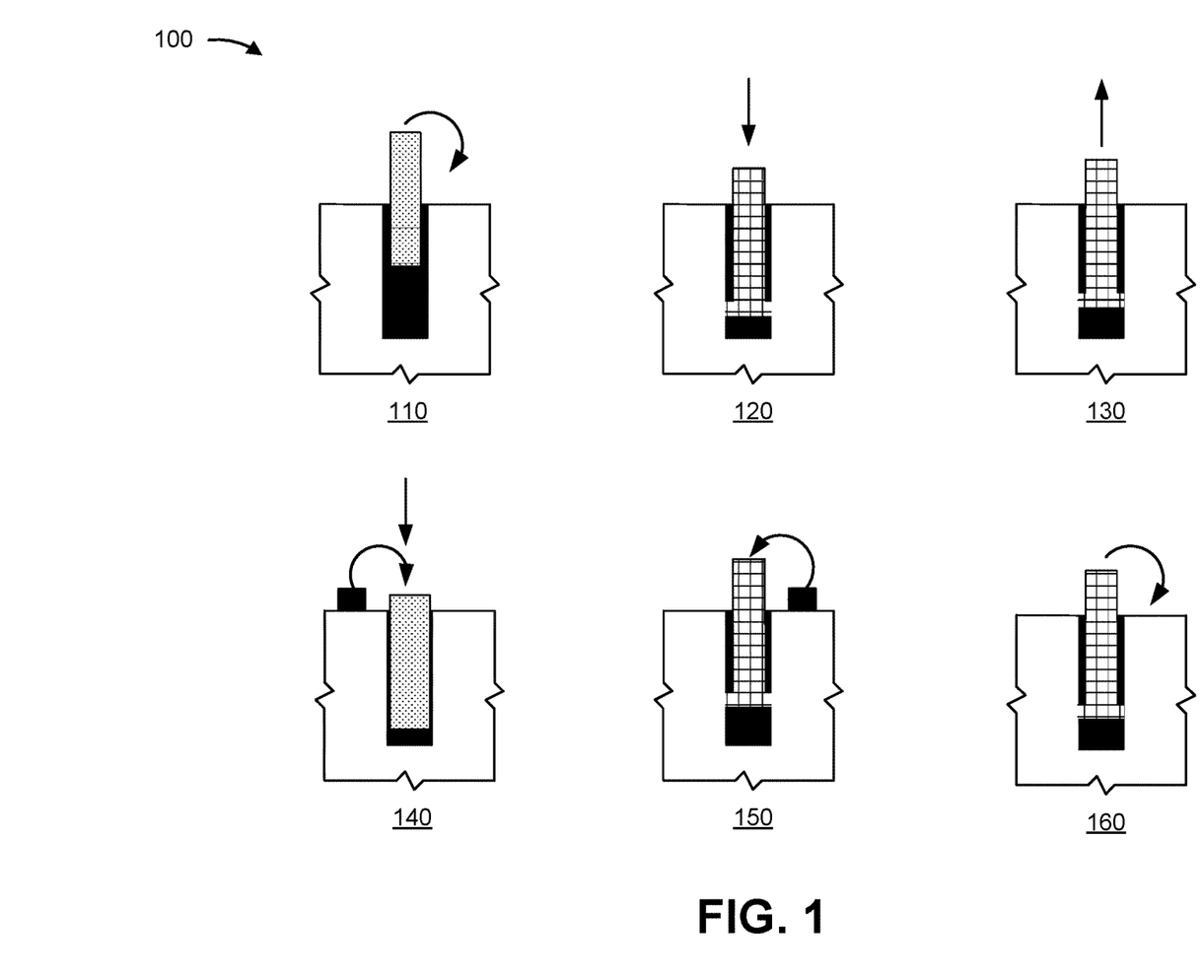
FIG. 1 is diagram of example stages of a drilling process described herein.

FIG. 1 is a diagram of example stages of an example drilling process 100 described herein. Drilling process 100 may be performed by a drilling rig. As shown in FIG. 1, drilling process 100 may include a spudding stage 110, a tripping-in stage 120, a tripping-out stage 130, a casing stage 140, a circulation stage 150, and/or a drilling stage 160.

Drilling process 100 may include a spudding stage 110. According to spudding stage 110, a drilling rig performs a reciprocating motion that forces tubing or a wireline tool into a wellbore.

Drilling process 100 may include a tripping-in stage 120. According to tripping-in stage 120, a drilling rig may insert a drill stem into a wellbore. Similarly, drilling process 100 may include a tripping-out stage 130. According to tripping-out stage 130, a drilling rig may withdraw a drill stem from a wellbore.

Drilling process 100 may include a casing stage 140. According to casing stage 140, a drilling rig may insert a casing (e.g., a pipe) into a wellbore. Cement may be pumped into the casing. The pumping may cause the cement to exit a bottom of the casing and travel up an annulus of the wellbore where the cement is allowed to cure.

Drilling process 100 may include a circulation stage 150. According to circulation stage 150, a drilling rig may pump (e.g., from a mud pump of the drilling rig) a drilling fluid (e.g., drilling mud) into a wellbore via a drill stem of the drilling rig. The pumping may cause the drilling fluid to exit the drill stem, travel up an annulus of the wellbore, and return to the drilling rig (e.g., to the mud pump of the drilling rig).

Drilling process 100 may include a drilling stage 160. According to drilling stage 160, a drilling rig may rotate a drill stem associated with a drill bit against a surface to form a well bore or extend a well bore.

Drilling process 100 also may include an idling stage, during which a drilling rig is not performing an action, and/or a packer installation stage, during which a drilling rig inserts and fixes a packer into a wellbore. A drilling rig may perform a stage of drilling process 100 one or more times during a drilling operation. For example, drilling process 100 may include multiple tripping-in stages 120, multiple tripping-out stages 130, multiple drilling stages 160, and/or the like. Moreover, a drilling rig may perform stages of drilling process 100 in a particular sequence during drilling operations.

As indicated above, FIG. 1 is provided as an example. Other examples may differ from what is described in connection with FIG. 1.

Figure 2:
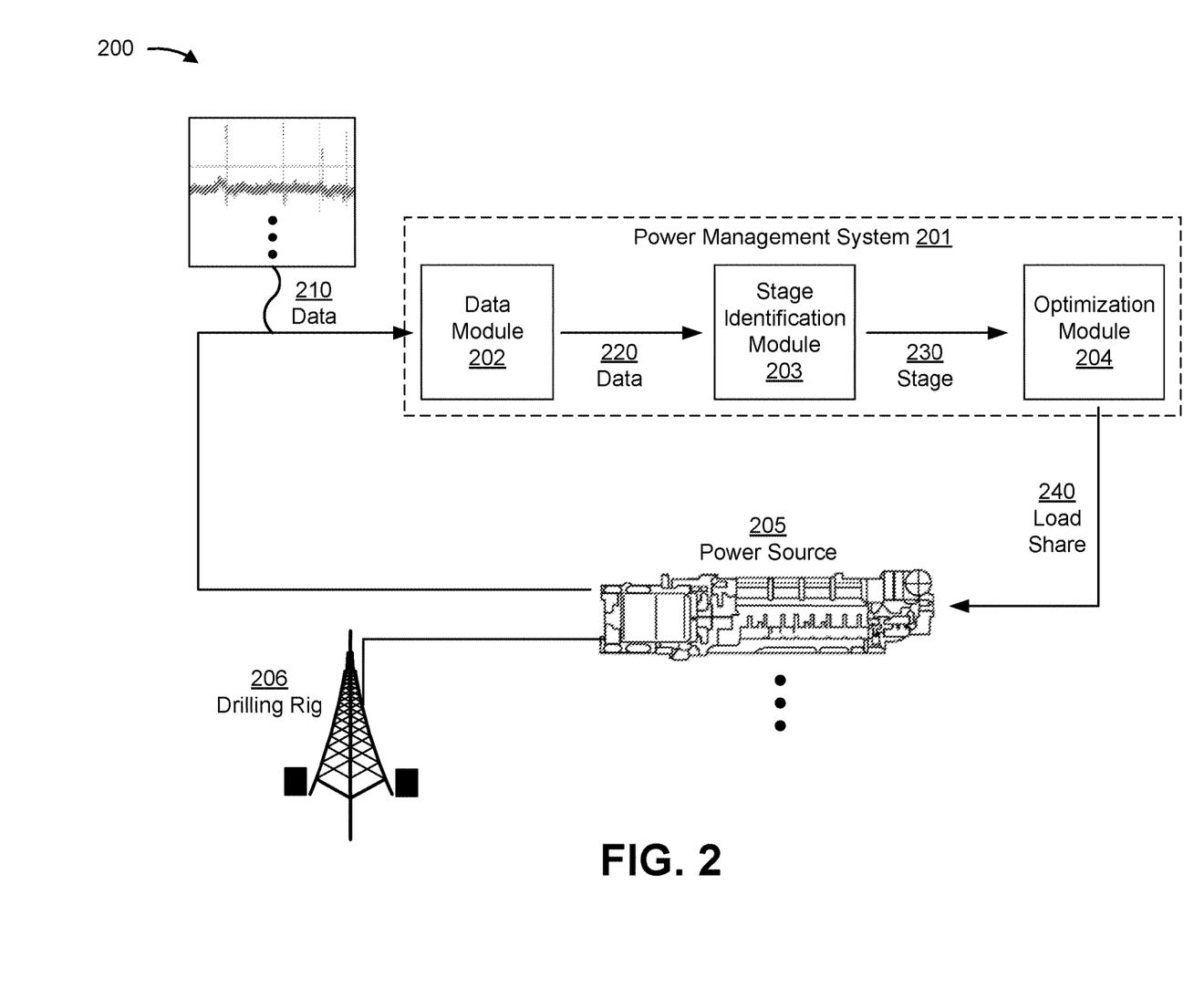
FIG. 2 is diagram of an example implementation including a power management system described herein.

FIG. 2 is a diagram of an example implementation 200 described herein. As shown in FIG. 2, example implementation 200 may include a power management system 201, a plurality of power sources 205, and a drilling rig 206.

Power management system 201 may include a data module 202, a stage identification module 203, and an optimization module 204. Power management system 201 may determine respective load shares for the plurality of power sources 205. Power management system 201 may be implemented by a controller that communicates with the plurality of power sources 205 and provides instructions to the plurality of power sources 205. Alternatively, power management system 201 may be associated with a power source 205 (e.g., a master power source 205) of the plurality of power sources 205. For example, power management system 201 may be implemented by an engine control module (ECM) of a power source 205. In such a case, the power source 205 associated with power management system 201 may communicate with the remaining power sources 205 and provide instructions to the remaining power sources 205.

A power source 205 may be an engine, such as a combustion engine. The engine may be connected to a generator to form a generator set. A total power output of the plurality of power sources 205 may be directed to drilling rig 206 to power drilling rig 206. In some implementations, a first power source 205 may be different (e.g., a different type, a different power capacity, a different fuel efficiency, a different speed, and/or the like) from a second power source 205.

Drilling rig 206 may be a land drilling rig, an offshore drilling rig, and/or the like. Drilling rig 206 may be associated with the plurality of power sources 205 (e.g., drilling rig 206 may have a wired connection with the plurality of power sources 205). For example, drilling rig 206 may receive power produced by the plurality of power sources 205 to perform a drilling operation. In some implementations, drilling rig 206 may include power management system 201 (e.g., in association with a controller of drilling rig 206).

As shown by reference number 210, data module 202 of power management system 201 may obtain data relating to the plurality of power sources 205. For example, data module 202 of power management system 201 may obtain a data stream (e.g., a time series) relating to each of the plurality of power sources 205. The data may include load data relating to a load on a power source 205 and/or speed data relating to a speed (e.g., revolutions per minute (RPM)) of a power source 205.

Data module 202 may aggregate the data relating to each of the plurality of power sources 205. For example, data module 202 may combine load data streams of each of the plurality of power sources 205 to produce a single load data stream, such as by averaging the load data streams, summing the load data streams, and/or the like. As another example, data module 202 may combine the speed data streams of each of the plurality of power sources 205 to produce a single speed data stream, such as by averaging the speed data streams, summing the speed data streams, and/or the like. Additionally, or alternatively, data module 202 may process the data (e.g., before combining data streams or after combining data streams) to remove noise from the data, normalize the data, sample the data (e.g., to reduce a size of the data), and/or the like. For example, data module 202 may process the data with a low-pass filter.

As shown by reference number 220, stage identification module 203 of power management system 201 may obtain the aggregated data (e.g., as raw data, combined data, processed data, and/or the like) from data module 202. Based on the data, stage identification module 203 may identify a stage of a drilling process being performed by drilling rig 206. Stage identification module 203 may identify the stage based on load data and/or speed data from a single power source 205. Alternatively, stage identification module 203 may identify the stage based on load data and/or speed data from multiple power sources 205 (e.g., individual load data and/or speed data from each of the multiple power sources 205 or combined load data and/or speed data from the multiple power sources 205).

Stage identification module 203 may identify a stage of a drilling process based on a signature (e.g., a pattern) for the stage present in the load data and/or the speed data. In other words, stage identification module 203 may analyze the load data and/or the speed data to identify a particular signature for a particular stage of the drilling process. Stage identification module 203 may analyze the load data and/or the speed data (e.g., a time series of the load data and/or the speed data) over a time period (e.g., 0.1 seconds, 1 second, 5 seconds, and/or the like) to identify a signature.

A particular stage of the drilling process may cause a power source 205 to exhibit particular load and/or speed parameters relating to fluctuations in the load and/or the speed, maximum values of the load and/or the speed, minimum values of the load and/or the speed, and/or the like. Moreover, these parameters may be associated with particular characteristics relating to a duration, a number of repetitions or cycles, a particular area under a curve (e.g., for a time series of the data), and/or the like.

Power management system 201 may maintain definitions of signatures for the stages in a data structure (e.g., a database, a linked list, a table, and/or the like). Stage identification module 203 may compare definitions to load data and/or speed data to identify a stage of a drilling process (e.g., according to a rule-based technique). A definition of a signature for a stage may include a combination of load parameters and/or characteristics, and/or speed parameters and/or characteristics. The definitions may be derived from a manual, or a computer-assisted, analysis of historical load data and/or speed data (e.g., to identify trends, threshold values for parameters, threshold values for characteristics, and/or the like). Alternatively, the definitions may be obtained from an outside source.

In addition to, or instead of, a rule-based technique, stage identification module 203 may use an artificial intelligence technique, such as machine learning, deep learning, and/or the like, to identify a stage of a drilling process in load data and/or speed data.

In this case, stage identification module 203 may generate a model of stage identification. For example, stage identification module 203 may train a model using information that includes historical load data, historical speed data, and/or the like, to identify a stage of a drilling process. As an example, stage identification module 203 may determine that past load parameters and/or characteristics, or speed parameters and/or characteristics, are associated with a threshold probability of being associated with a particular stage.

Stage identification module 203 may use a scoring system (e.g., with relatively high scores and/or relatively low scores) to identify and/or classify stages as being associated with one another. In this case, stage identification module 203 may determine that a relatively high score (e.g., as being likely to be identified) is to be assigned to load parameters and/or characteristics or speed parameters and/or characteristics that are determined to be the same or similar as previously identified load parameters and/or characteristics or speed parameters and/or characteristics of a particular stage (or more frequently identified than past identified parameters and/or characteristics). In contrast, stage identification module 203 may determine that a relatively low score (e.g., as being unlikely to be identified) is to be assigned to load parameters and/or characteristics or speed parameters and/or characteristics of a particular stage that are determined to be different than past identified load parameters and/or characteristics or speed parameters and/or characteristics of the particular stage (or less frequently identified than past identified parameters and/or characteristics).

Stage identification module 203 may perform a training operation when generating the model of stage identification. For example, stage identification module 203 may portion load data and/or speed data into a training set (e.g., a set of data to train the model), a validation set (e.g., a set of data used to evaluate a fit of the model and/or to fine tune the model), a test set (e.g., a set of data used to evaluate a final fit of the model), and/or the like. Stage identification module 203 may preprocess and/or perform dimensionality reduction to reduce the load data and/or speed data to a minimum feature set. Stage identification module 203 may train the model of stage identification on this minimum feature set, thereby reducing processing to train the machine learning model, and may apply a classification technique to the minimum feature set.

Stage identification module 203 may use a classification technique, such as a logistic regression classification technique, a random forest classification technique, a gradient boosting machine learning (GBM) technique, and/or the like, to determine a categorical outcome (e.g., that load data and/or speed data identify a particular stage, that load data and/or speed data do not identify a particular stage, and/or the like). Additionally, or alternatively, stage identification module 203 may use a naïve Bayesian classifier technique. In this case, stage identification module 203 may perform binary recursive partitioning to split the data of the minimum feature set into partitions and/or branches and use the partitions and/or branches to perform predictions (e.g., that load data and/or speed data identify a particular stage, that load data and/or speed data do not identify a particular stage, and/or the like).

Additionally, or alternatively, stage identification module 203 may use a support vector machine (SVM) classifier technique to generate a non-linear boundary between data points in the training set. In this case, the non-linear boundary is used to classify test data (e.g., data relating load parameters and/or characteristics or speed parameters and/or characteristics of a stage) into a particular class (e.g., a class indicating that load data and/or speed data identify a particular stage, a class indicating that load data and/or speed data do not identify a particular stage, and/or the like).

Additionally, or alternatively, stage identification module 203 may train the model of stage identification using a supervised training procedure that includes receiving input to the model from a subject matter expert. Additionally, stage identification module 203 may use one or more other model training techniques, such as a neural network technique, a latent semantic indexing technique, and/or the like. For example, stage identification module 203 may perform an artificial neural network processing technique (e.g., using a two-layer feedforward neural network architecture, a three-layer feedforward neural network architecture, and/or the like) to perform pattern recognition.

As an example, stage identification module 203 may use a supervised multi-label classification technique to train the model. For example, as a first step, stage identification module 203 may map load parameters and/or characteristics or speed parameters and/or characteristics to a stage of a drilling process. In this case, the parameters and/or characteristics may be characterized as being associated with a particular stage or not associated with a particular stage based on features of the parameters and/or characteristics (e.g., whether a feature of a parameter and/or characteristic is similar or associated with a feature of a stage) and an analysis of the parameters and/or characteristics (e.g., by a technician). As a second step, stage identification module 203 may determine classifier chains, whereby labels of target variables may be correlated (e.g., in this example, labels may be parameters and/or characteristics and correlation may refer to a common feature of a stage). In this case, stage identification module 203 may use an output of a first label as an input for a second label (as well as one or more input features, which may be other data relating to the stage), and may determine a likelihood that a particular parameter and/or characteristic that includes a set of features (some of which are associated with a particular stage and some of which are not associated with the particular stage) are associated with the particular stage based on a similarity to other parameters and/or characteristics that include similar features. As a third step, stage identification module 203 may determine a Hamming Loss Metric relating to an accuracy of a label in performing a classification by using the validation set of the data. For example, an accuracy with which a weighting applied to each parameter and/or characteristic and whether each parameter and/or characteristic is associated with a particular stage, results in a correct prediction of whether load data and/or speed data identify a stage, thereby accounting for differing amounts to which association of any one parameter and/or characteristic influences whether load data and/or speed data identify a stage. As a fourth step, stage identification module 203 may finalize the model based on labels that satisfy a threshold accuracy associated with the Hamming Loss Metric and may use the model for subsequent prediction of whether parameters and/or characteristics of a stage are to result in the identification of the stage.

As another example, stage identification module 203 may determine, using a linear regression technique, that a threshold percentage of parameters and/or characteristics, in a set of parameters and/or characteristics, are not associated with a particular stage, and may determine that those parameters and/or characteristics are to receive relatively low association scores. In contrast, stage identification module 203 may determine that another threshold percentage of parameters and/or characteristics are associated with a particular stage and may assign a relatively high association score to those parameters and/or characteristics. Based on whether parameters and/or characteristics identify a stage, stage identification module 203 may generate the model of stage identification and may use the model of stage identification for analyzing new parameters and/or characteristics, and/or the like that stage identification module 203 identifies.

In some implementations, stage identification module 203 may predict (e.g., using a rule-based technique and/or an artificial intelligence technique) a future stage of a drilling process based on a stage that is identified. For example, stage identification module 203 may predict the future stage based on one or more parameters and/or characteristics of the stage that is identified. In addition, stage identification module 203 may predict a future stage of a drilling process based on a plurality of stages that are identified. For example, stage identification module 203 may predict the future stage based on a sequence of the plurality of stages that are identified. Stage identification module 203 also may predict a transition time associated with a transition from the stage to the future stage.

As shown by reference number 230, optimization module 204 may obtain information identifying the stage of the drilling process determined by stage identification module 203. Based on the stage, optimization module 204 may determine respective load shares for the plurality of power sources 205. Optimization module 204 may determine the respective load shares for the plurality of power sources 205 in order to achieve a particular fuel consumption of the plurality of power sources 205. The particular fuel consumption may be an optimum (e.g., a minimum) fuel consumption of the plurality of power sources 205 that is able to provide a power output needed by drilling rig 206 to perform the stage that is identified.

The respective load shares for the plurality of power sources 205 may be based on characteristics of the stages. For example, a stage may be associated with a particular total power demand (e.g., a total power output that is to be directed from the plurality of power sources 205 to drilling rig 206), a particular duration, a particular response time requirement, and/or the like.

In addition, the respective load shares for the plurality of power sources 205 may be based on characteristics of the plurality of power sources 205. For example, a power source 205 may be associated with a particular type (e.g., a gasoline engine, a diesel engine, and/or the like), a particular capacity, a particular speed, a particular fuel efficiency, a particular response time, a particular age, a particular location on a bus, and/or the like. Thus, a power source 205 may be better suited for certain stages of a drilling process and less suited for certain other stages of the drilling process based on the characteristics of the power source 205.

Accordingly, optimization module 204 may determine respective load shares for the plurality of power sources 205 based on the characteristics of the plurality of power sources 205 and the characteristics of the stage that is identified. For example, if that stage that is identified is a low-load operation, optimization module 204 may assign a higher load share to a power source 205 that has a lower capacity but a higher efficiency relative to other power sources 205.

Additionally, optimization module 204 may assign priorities to the plurality of power sources 205 in order to determine respective load shares for the plurality of power sources 205. The priorities may be based on the characteristics of the plurality of power sources 205 and the characteristics of the stage that is identified. For example, if the stage that is identified is a brief, high-load operation, optimization module 204 may assign a lower priority to a power source 205 that has a slower response time relative to other power sources 205. A power source 205 associated with a lower priority may be assigned no load share until all higher-priority power sources 205 have reached a load threshold.

Power management system 201 may maintain information relating to the characteristics of the plurality of power sources 205 and/or information relating to the characteristics of the stages in a data structure (e.g., a database, a linked list, a table, and/or the like). Such information may be input to power management system 201 by a user of power management system 201.

After obtaining information identifying the stage that is determined, optimization module 204 may obtain information relating to the characteristics of the plurality of power sources 205 and/or the characteristics of the stages to determine respective load shares for the plurality of power sources 205. For example, optimization module 204 may use an optimization algorithm (e.g., a particle swarm optimization algorithm) on the information relating to the characteristics and/or the stages of the plurality of power sources 205 to determine respective load shares for the plurality of power sources 205 that achieve a minimum fuel consumption.

In addition, optimization module 204 may use a rule-based technique to determine respective load shares for the plurality of power sources 205. According to the rule-based technique, a user of power management system 201 may determine (e.g., prior to a drilling operation) respective load shares for the plurality of power sources 205 for a particular stage (e.g., based on characteristics of the plurality of power sources 205 and characteristics of the particular stage), and these respective load shares may be implemented by optimization module 204 for the particular stage during a drilling operation.

In addition to, or instead of, an optimization algorithm or a rule-based technique, optimization module 204 may use an artificial intelligence technique to determine load shares in a manner similar to that described above with regard to stage identification module 203. For example, power management system 201, or another device, may train a model based on data relating to stages of a drilling process and data relating to the plurality of power sources 205. Optimization module 204 may use the model to determine respective load shares for the plurality of power sources 205 based on characteristics of a stage and/or the plurality of power sources 205 that are input to the model.

In some implementations, optimization module 204 may obtain a predicted future stage of a drilling process from stage identification module 203. In such a case, optimization module 204 may determine future respective load shares for the plurality of power sources 205, as described above, based on the future stage.

As shown by reference number 240, power management system 201 (e.g., optimization module 204 of power management system 201) may provide to the plurality of power sources 205 (e.g., to ECMs of the plurality of power sources 205) information relating to the load shares that are determined. In addition, power management system 201 may provide to the plurality of power sources 205 information relating to future load shares that are determined, to permit the plurality of power sources 205 to transition (e.g., based on a transition time predicted by stage identification module 203) from a first load sharing configuration to a second load sharing configuration without instruction from power management system 201.

Power management system 201 may manage load sharing among the plurality of power sources 205 according to the respective load shares for the plurality of power sources 205 that are determined. In other words, power management system 201 may provide instructions to a power source 205 that instruct the power source 205 to produce power according to a load share determined for the power source 205. The instructions may identify a percentage of a capacity of the power source 205 at which the power source 205 is to produce power. Additionally, or alternatively, the instructions may identify a particular power (e.g., in watts) that the power source 205 is to produce.

Power management system 201 may continuously monitor load data and/or speed data of the plurality of power sources 205 to identify transitions between stages of a drilling process.

As indicated above, FIG. 2 is provided as an example. Other examples may differ from what is described in connection with FIG. 2.

Figure 3:
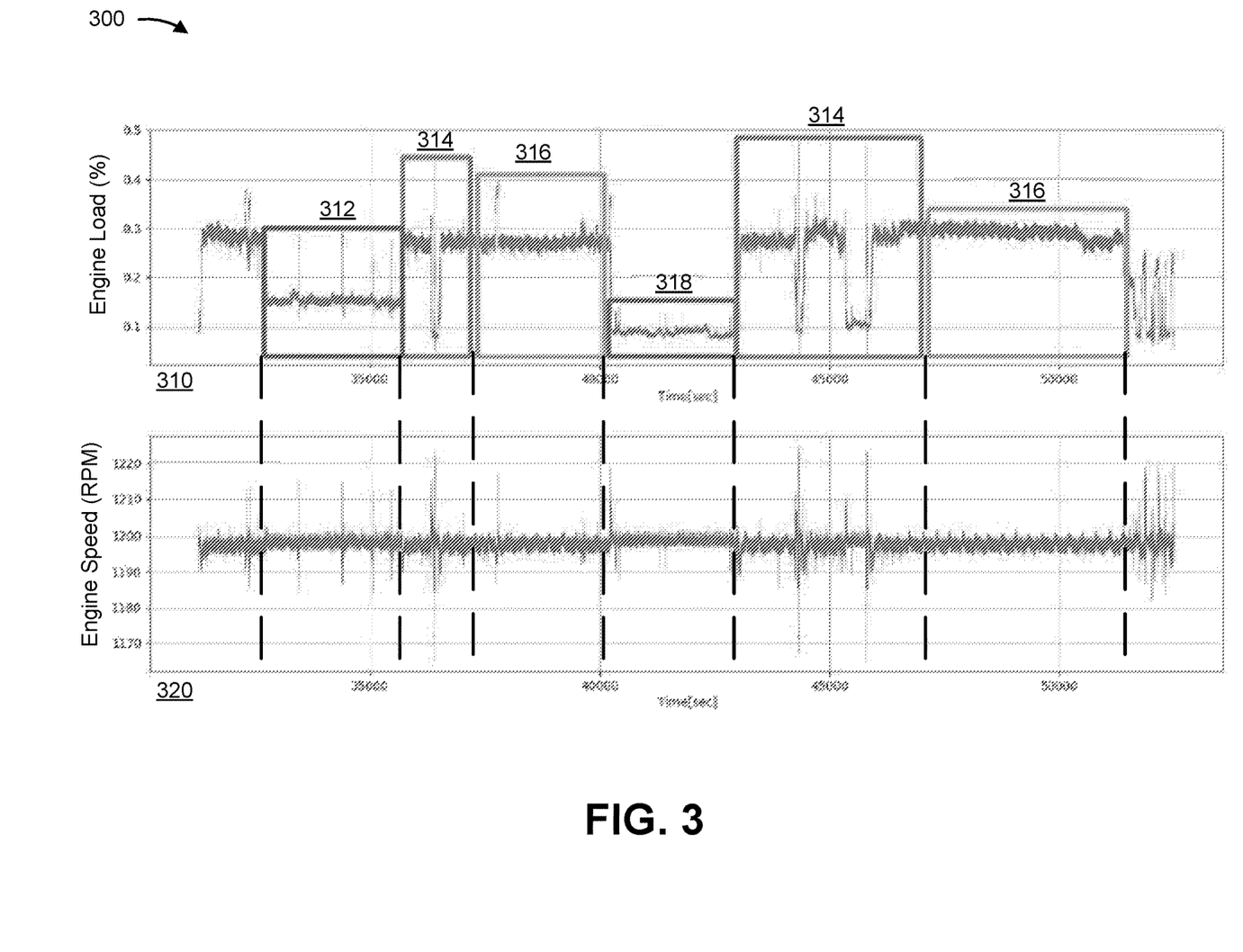
FIG. 3 is a diagram of an example representation of data that may be used by the power management system of FIG. 2, as described herein.

FIG. 3 is a diagram of an example representation of data 300 that may be used by power management system 201. As shown in FIG. 3, the example representation of data 300 may include time series data. The time series data may include load data 310 relating to a load on a power source of a drilling rig and/or speed data 320 relating to a speed of the power source. Load data 310 may relate to a load on a power source that is expressed as a percentage of a capacity of the power source. Speed data 320 may relate to an RPM of a rotational element of the power source.

As shown in FIG. 3, load data 310 may include load values for a load on a power source over a time period. The load values may include various patterns that may be used to identify stages of a drilling process in a manner similar to that described above. For example, the load values may form a first pattern 312 that is associated with a tripping-in stage of a drilling process, a second pattern 314 that is associated with a drilling stage of the drilling process, a third pattern 316 that is associated with a circulation stage of the drilling process, and a fourth pattern 318 that is associated with an idling stage of the drilling process.

Similarly, speed data 320 may include speed values of a power source over a time period. The speed values may include various patterns that may be used to identify stages of a drilling process in a manner similar to that described above. Power management system 101 may identify a stage of a drilling process based on load data 310 and speed data 320. For example, load data 310 may include a first pattern of load values (e.g., over a time period) and speed data 320 may include a second pattern of speed values (e.g., over the time period), and a combination of the first pattern and the second pattern may identify a stage of a drilling process.

As indicated above, FIG. 3 is provided as an example. Other examples may differ from what is described in connection with FIG. 3.

Figure 4:
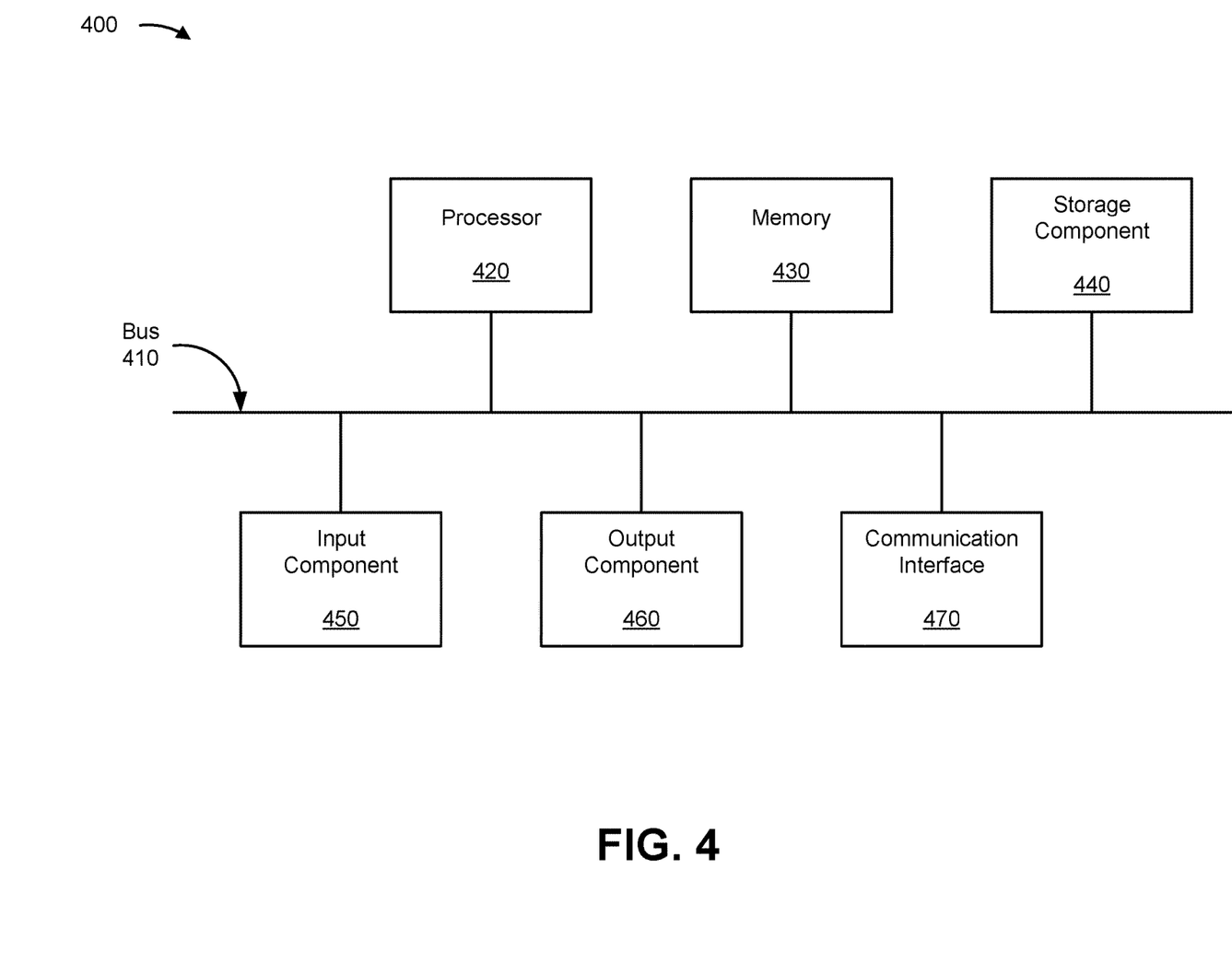
FIG. 4 is a diagram of example components of a device implementing the power management system of FIG. 2.

FIG. 4 is a diagram of example components of a device 400. Device 400 may correspond to a controller (e.g., a controller of drilling rig 206) and/or an ECM (e.g., an ECM of a power source 205). Power management system 201 may be implemented by one or more devices 400 and/or one or more components of device 400. As shown in FIG. 4, device 400 can include a bus 410, a processor 420, a memory 430, a storage component 440, an input component 450, an output component 460, and a communication interface 470.

Bus 410 includes a component that permits communication among multiple components of device 400. Processor 420 is implemented in hardware, firmware, and/or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random-access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 can include a hard disk (e.g., a magnetic disk, an optical disk, and/or a magneto-optic disk), a solid-state drive (SSD), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 can include a component for determining location (e.g., a global positioning system (GPS) component) and/or a sensor (e.g., an accelerometer, a gyroscope, an actuator, another type of positional or environmental sensor, and/or the like). Output component 460 includes a component that provides output information from device 400 (via, e.g., a display, a speaker, a haptic feedback component, an audio or visual indicator, and/or the like).

Communication interface 470 includes a transceiver-like component (e.g., a transceiver, a separate receiver, a separate transmitter, and/or the like) that enables device 400 to communicate with other devices, such as via a wired connection, a wireless connection, or a combination of wired and wireless connections. Communication interface 470 can permit device 400 to receive information from another device and/or provide information to another device. For example, communication interface 470 can include an Ethernet interface, an optical interface, a coaxial interface, an infrared interface, a radio frequency (RF) interface, a universal serial bus (USB) interface, a wireless local area network interface, a cellular network interface, and/or the like.

Device 400 can perform one or more processes described herein. Device 400 can perform these processes based on processor 420 executing software instructions stored by a non-transitory computer-readable medium, such as memory 430 and/or storage component 440. As used herein, the term "computer-readable medium" refers to a non-transitory memory device. A memory device includes memory space within a single physical storage device or memory space spread across multiple physical storage devices.

Software instructions can be read into memory 430 and/or storage component 440 from another computer-readable medium or from another device via communication interface 470. When executed, software instructions stored in memory 430 and/or storage component 440 can cause processor 420 to perform one or more processes described herein. Additionally, or alternatively, hardware circuitry can be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 can include additional components, fewer components, different components, or differently arranged components than those shown in FIG. 4. Additionally, or alternatively, a set of components (e.g., one or more components) of device 400 can perform one or more functions described as being performed by another set of components of device 400.

Figure 5:
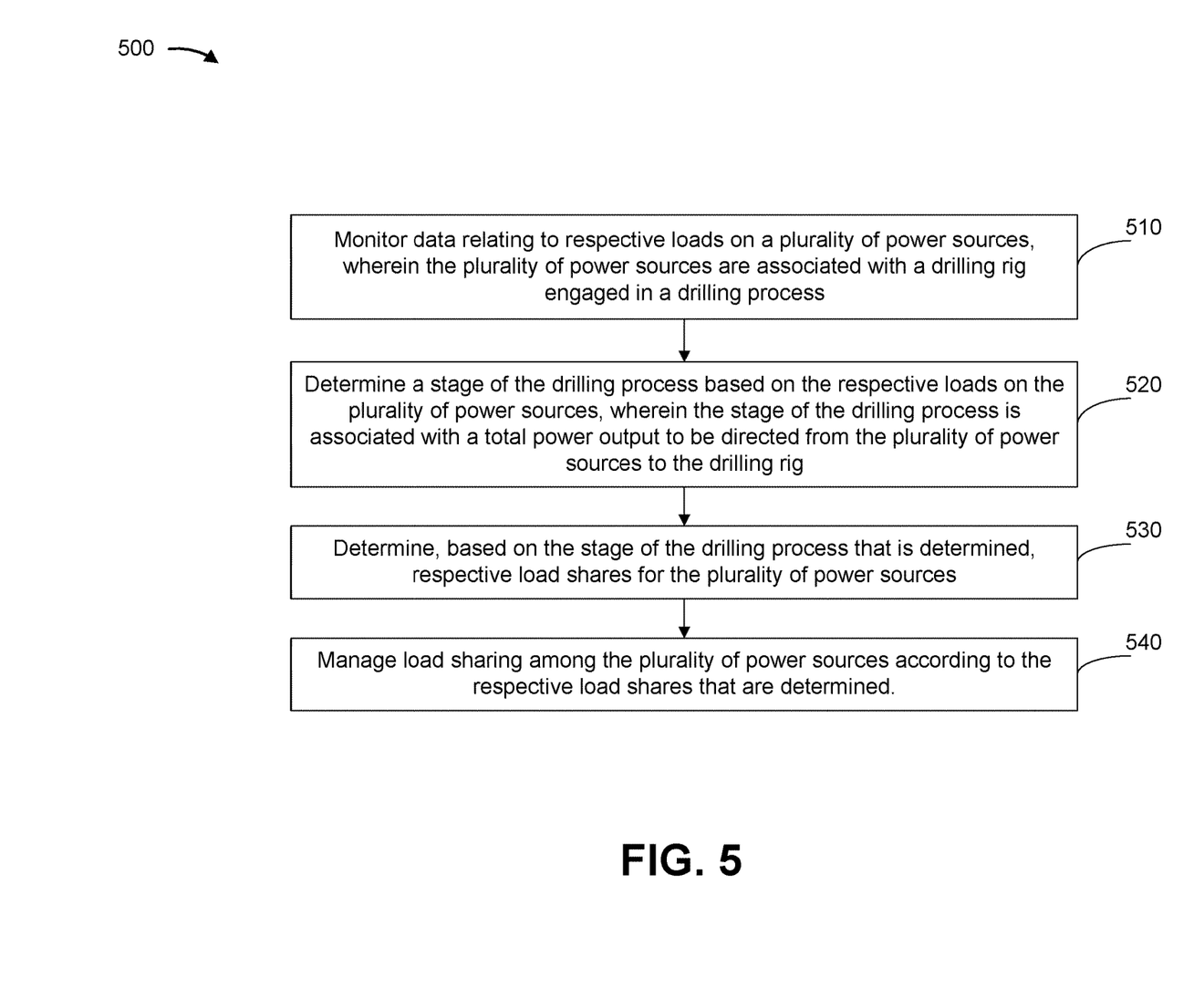
FIG. 5 is a flow chart of an example process associated with power management for a drilling rig.

FIG. 5 is a flow chart of an example process 500 associated with power management for a drilling rig. One or more process blocks of FIG. 5 may be performed by a power management system (e.g., power management system 201). Additionally, or alternatively, one or more process blocks of FIG. 5 may be performed by another device or a group of devices separate from or including the power management system, such as a controller associated with a drilling rig (e.g., a controller associated with drilling rig 206), an ECM associated with a power source (e.g., an ECM associated with a power source 205), and/or another device or component that is internal or external to a drilling rig that includes the plurality of power sources 205.

As shown in FIG. 5, process 500 may include monitoring data relating to respective loads on a plurality of power sources, wherein the plurality of power sources are associated with a drilling rig engaged in a drilling process (block 510). For example, the power management system (e.g., using processor 420, memory 430, storage component 440, input component 450, communication interface 470, data module 202, and/or the like) may monitor data relating to respective loads on a plurality of power sources, as described above. The plurality of power sources may be associated with a drilling rig engaged in a drilling process.

As further shown in FIG. 5, process 500 may include determining a stage of the drilling process based on the respective loads on the plurality of power sources, wherein the stage of the drilling process is associated with a total power output to be directed from the plurality of power sources to the drilling rig (block 520). For example, the power management system (e.g., using processor 420, memory 430, storage component 440, stage identification module 203, and/or the like) may determine a stage of the drilling process based on the respective loads on the plurality of power sources, as described above. The stage of the drilling process may be associated with a total power output to be directed from the plurality of power sources to the drilling rig.

As further shown in FIG. 5, process 500 may include determining, based on the stage of the drilling process that is determined, respective load shares for the plurality of power sources (block 530). For example, the power management system (e.g., using processor 420, memory 430, storage component 440, optimization module 204, and/or the like) may determine, based on the stage of the drilling process that is determined, respective load shares for the plurality of power sources, as described above.

As further shown in FIG. 5, process 500 may include managing load sharing among the plurality of power sources according to the respective load shares that are determined (block 540). For example, the power management system (e.g., using processor 420, memory 430, storage component 440, output component 360, communication interface 370, optimization module 104, and/or the like) may manage load sharing among the plurality of power sources according to the respective load shares that are determined, as described above.

Process 500 may include additional implementations, such as any single implementation or any combination of implementations described below and/or in connection with one or more other processes described elsewhere herein.

For example, the data may be time series data relating to the respective loads. The total power output may be based on historical data relating to the stage of the drilling process.

The stage of the drilling process may be one of a spudding stage, a casing stage, a tripping-in stage, a tripping-out stage, or a drilling stage. The stage may be a first stage and the respective load shares may be first respective load shares. The power management system may predict a second stage of the drilling process based on the first stage, predict a transition time from the first stage to the second stage based on the first stage, determine, based on the second stage of the drilling process that is predicted, second respective load shares for the plurality of power sources, and prepare the plurality of power sources for load sharing according to the second respective load shares. Load sharing according to the second respective load shares may occur upon reaching the transition time.

The power management system, when determining the stage of the drilling process, may determine the stage of the drilling process using a first model. The power management system, when determining the respective load shares for the plurality of power sources, may determine the respective load shares for the plurality of power sources using a second model. The respective load shares for the plurality of power sources may be determined in order to achieve a particular fuel consumption of the plurality of power sources.

The data may relate to respective loads on the plurality of power sources and respective speeds of the plurality of power sources, and the power management system, when determining the stage of the drilling process, may determine the stage of the drilling process based on the respective loads on the plurality of power sources and the respective speeds of the plurality of power sources. In such a case, the data may include first time series data relating to the respective loads and second time series data relating to the respective speeds. In addition, the power management system, when determining the stage of the drilling process, may determine the stage of the drilling process based on a pattern of load values over a time period and a pattern of speed values over the time period.

The power management system may determine respective operating priorities for the plurality of power sources. The power management system, when determining the respective load shares for the plurality of power sources, may determine the respective load shares for the plurality of power sources based on the stage of the drilling process that is determined and the respective operating priorities for the plurality of power sources.

A power source of the plurality of power sources may be an engine that is associated with a generator. The power management system may be implemented by an engine control module of a power source of the plurality of power sources. Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

INDUSTRIAL APPLICABILITY

The disclosed power management system 201 may be used with any drilling machine where improved fuel efficiency is desired. The disclosed power management system 201 may determine respective load shares for a plurality of power sources that power a drilling rig based on data relating to loads on the plurality of power sources and/or speeds of the plurality of power sources. Accordingly, power management system 201 reduces fuel consumption of the plurality of power sources through optimization of load sharing in connection with a particular stage of the drilling process.

Furthermore, power management system 201 provides for automatic identification of stages of the drilling process. As such, power management system 201 may eliminate a need for a crew of a drilling rig to manually input information relating to a stage of the drilling process, which is prone to human error. In this way, power management system 201 can reduce wear to, and/or prolong a life of, a power source and/or a drilling rig that might otherwise be damaged when human error results in a power source providing too much or too little power.

As used herein, the articles "a" and "an" are intended to include one or more items, and may be used interchangeably with "one or more." Also, as used herein, the terms "has," "have," "having," or the like are intended to be open-ended terms. Further, the phrase "based on" is intended to mean "based, at least in part, on."

The foregoing disclosure provides illustration and description, but is not intended to be exhaustive or to limit the implementations to the precise form disclosed. Modifications and variations may be made in light of the above disclosure or may be acquired from practice of the implementations. It is intended that the specification be considered as an example only, with a true scope of the disclosure being indicated by the following claims and their equivalents. Even though particular combinations of features are recited in the claims and/or disclosed in the specification, these combinations are not intended to limit the disclosure of various implementations. Although each dependent claim listed below may directly depend on only one claim, the disclosure of various implementations includes each dependent claim in combination with every other claim in the claim set.

What is claimed is:

1. A method, comprising:
   monitoring, by a device, data relating to respective loads on a plurality of power sources,
   wherein the plurality of power sources are associated with a drilling rig engaged in a drilling process;
   determining, by the device, a stage of the drilling process based on the respective loads on the plurality of power sources,
   wherein the stage of the drilling process is associated with a total power output to be directed from the plurality of power sources to the drilling rig;
   determining, by the device and based on the stage of the drilling process that is determined, respective load shares for the plurality of power sources; and
   managing, by the device, load sharing among the plurality of power sources according to the respective load shares that are determined.

2. The method of claim 1, wherein the stage of the drilling process is one of:
   a spudding stage,
   a casing stage,
   a tripping-in stage,
   a tripping-out stage,
   a circulation stage, or
   a drilling stage.

3. The method of claim 1, wherein the stage is a first stage and the respective load shares for the plurality of power sources are first respective load shares for the plurality of power sources,
   wherein the method further comprises:
      predicting a second stage of the drilling process based on the first stage;
      predicting a transition time from the first stage to the second stage based on the first stage;
      determining, based on the second stage of the drilling process that is predicted, second respective load shares for the plurality of power sources; and
      preparing the plurality of power sources for load sharing according to the second respective load shares,
         wherein load sharing according to the second respective load shares is to occur upon reaching the transition time.

4. The method of claim 1, wherein the respective load shares for the plurality of power sources are determined in order to achieve a particular fuel consumption of the plurality of power sources.

5. The method of claim 1, wherein the data relates to the respective loads on the plurality of power sources and respective speeds of the plurality of power sources,
   wherein determining the stage of the drilling process is based on the respective loads on the plurality of power sources and the respective speeds of the plurality of power sources.

6. The method of claim 1, wherein a power source of the plurality of power sources is an engine that is associated with a generator.

7. The method of claim 1, wherein the device is an engine control module of a power source of the plurality of power sources.

8. A power management system, comprising:
   one or more memories; and
   one or more processors, communicatively coupled to the one or more memories, to:
      monitor data relating to respective loads on a plurality of power sources and respective speeds of the plurality of power sources,
         wherein the plurality of power sources are associated with a drilling rig engaged in a drilling process;

determine a stage of the drilling process based on the respective loads on the plurality of power sources and the respective speeds of the plurality of power sources,
  wherein the stage of the drilling process is associated with a total power output to be directed from the plurality of power sources to the drilling rig;
determine, based on the stage of the drilling process that is determined, respective load shares for the plurality of power sources; and
manage load sharing among the plurality of power sources according to the respective load shares that are determined.

9. The power management system of claim 8, wherein the data includes first time series data relating to the respective loads and second time series data relating to the respective speeds.

10. The power management system of claim 8, wherein the stage of the drilling process is one of:
a spudding stage,
a casing stage,
a tripping-in stage,
a tripping-out stage,
a circulation stage, or
a drilling stage.

11. The power management system of claim 8, wherein the one or more processors, when determining the stage of the drilling process, are to:
determine the stage of the drilling process using a first model,
  wherein the one or more processors, when determining the respective load shares for the plurality of power sources, are to:
determine the respective load shares for the plurality of power sources using a second model.

12. The power management system of claim 8, wherein the one or more processors, when determining the stage of the drilling process, are to:
determine the stage of the drilling process based on a pattern of load values over a time period and a pattern of speed values over the time period.

13. The power management system of claim 8, wherein the respective load shares for the plurality of power sources are determined in order to achieve a particular fuel consumption for the plurality of power sources.

14. The power management system of claim 8, wherein the total power output is based on historical data relating to the stage of the drilling process.

15. A drilling rig comprising:
a plurality of power sources that power the drilling rig; and
a power management system, wherein the power management system is to:
monitor data relating to respective loads on the plurality of power sources;
determine a stage of a drilling process performed by the drilling rig based on the respective loads on the plurality of power sources,
  wherein the stage of the drilling process is associated with a total power output to be directed from the plurality of power sources to the drilling rig;
determine, based on the stage of the drilling process that is determined, respective load shares for the plurality of power sources; and
manage load sharing among the plurality of power sources according to the respective load shares for the plurality of power sources that are determined.

16. The drilling rig of claim 15, wherein the data is time series data relating to the respective loads.

17. The drilling rig of claim 15, wherein the data relates to the respective loads on the plurality of power sources and respective speeds of the plurality of power sources,
wherein the power management system, when determining the stage of the drilling process, is to:
determine the stage of the drilling process based on the respective loads on the plurality of power sources and the respective speeds of the plurality of power sources.

18. The drilling rig of claim 15, wherein the stage of the drilling process is one of:
a spudding stage,
a casing stage,
a tripping-in stage,
a tripping-out stage,
a circulation stage, or
a drilling stage.

19. The drilling rig of claim 15, wherein the power management system is further to:
determine respective operating priorities for the plurality of power sources,
  wherein the power management system, when determining the respective load shares for the plurality of power sources, is to:
determine the respective load shares for the plurality of power sources based on the stage of the drilling process that is determined and the respective operating priorities for the plurality of power sources.

20. The drilling rig of claim 15, wherein a power source of the plurality of power sources is an engine that is associated with a generator.

* * * * *